United States Patent

Machida et al.

(10) Patent No.: US 8,546,937 B2
(45) Date of Patent: Oct. 1, 2013

(54) SEMICONDUCTOR DEVICE (75) Inventors: Osamu Machida, Niiza (JP);
Michiyoshi Izawa, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 93 days.

(21) Appl. No.: 13/033,251

(22) Filed: Feb. 23, 2011

(65) Prior Publication Data
US 2011/0233758 A1    Sep. 29, 2011

(30) Foreign Application Priority Data

Mar. 26, 2010    (JP) .................. 2010-073044

(51) Int. Cl.
*H01L 23/34* (2006.01)
*H01L 23/48* (2006.01)

(52) U.S. Cl.
USPC .. 257/717; 257/782; 257/E23.01; 257/E23.08

(58) Field of Classification Search
USPC ................. 257/717, 782, E23.01, E23.08
See application file for complete search history.

(56) References Cited

U.S. PATENT DOCUMENTS

| 2004/0095729 A1* | 5/2004 | Vaysse et al. | 361/710 |
| 2008/0252372 A1* | 10/2008 | Williams | 330/251 |

FOREIGN PATENT DOCUMENTS

| JP | 2003-348874 | 12/2003 |
| JP | 2009-130055 | 6/2009 |

* cited by examiner

*Primary Examiner* — Peniel M Gumedzoe
(74) *Attorney, Agent, or Firm* — Oblon, Spivak, McClelland, Maier & Neustadt, L.L.P.

(57) ABSTRACT

A semiconductor devices includes a first die pad having the conductivity connected to one end of a DC power source, a second die pad having the conductivity connected to the other end of the DC power source, a first switching element provided on the first die pad, receiving DC power from the DC power source via the first die pad, and having a terminal opposite to the first die pad connected to a first output terminal, and a second switching element provided on the second die pad, receiving the DC power from the DC power source via the second die pad, and connected to the first output terminal, and having a terminal opposite to the second die pad.

11 Claims, 6 Drawing Sheets

SEMICONDUCTOR DEVICE

CROSS REFERENCE TO RELATED APPLICATION

This application is based upon and claims the benefit of priority from the prior Japanese Patent Application No. 2010-073,044 filed on Mar. 26, 2010, the entire contents of which is incorporated herein by reference.

BACKGROUND OF THE INVENTION

1. Field of the Invention

The present invention relates to a semiconductor device, and more particularly relates to a semiconductor device in which bridge circuits are made up by switching elements mounted on die pads.

2. Description of the Related Art

Semiconductor devices for driving three-phase motors are in wide use in order to control operations of motors which are used for not only home electric applications and industrial electric applications but also for compressors of air conditioning units, drums of washing machines, and pumps so on. Patent Document 1 (Laid-Open Patent Publication No. 2003-348874) discloses a drive circuit of a semiconductor device for driving a three-phase motor with reference to FIG. 3. In the drive circuit, three half-bridge circuits in which high side (H-side) switching elements and low side (L-side) switching elements are connected in series are prepared for a phase U, a phase V, and a phase W. Further, the three half-bridge circuits are electrically connected in parallel. In short, the drive circuit includes a total of six switching elements. The high-side switching elements have their drain electrodes electrically connected to one end of a DC power source (having a fixed potential at a high voltage side), and have their source electrodes electrically connected to output terminals for the phases U, V and W in parallel. The low-side switching elements have their drain electrodes electrically connected to output terminals for the phases U, V and W in parallel, and have their source electrodes electrically connected to the other end of the DC power source (having a fixed potential at a low voltage side) in parallel.

Patent Document 2 (Laid-Open Patent Publication No. 2009-130055) discloses a specific structure of a semiconductor device which is suitable to driving a three-phase motor. The semiconductor device includes not only a vertical power MOSFET (metal oxide semiconductor field elect transistor) as a high-side switching element on one drain lead but also another vertical power MOSFET as a low-side switching element on the other drain lead. The high-side power MOSFET has a drain electrode on a rear surface of a semiconductor chip. The drain electrode is connected to one end of the DC power source via a drain lead. Further, the high-side power MOSFET includes a source electrode on a front surface of the semiconductor chip. The source electrode is connected not only to an output terminal via a wire and a source lead but also to a low-side drain lead. On the other hand, the low-side power MOSFET has a drain electrode on the rear surface of the semiconductor chip. The drain electrode is connected to the output terminal via a drain lead. Further, the low-side power MOSFET has a source electrode on the front surface of the semiconductor chip. The source electrode is connected to the other end of the DC power source via a wire and a source lead.

The semiconductor device of the Patent Document 2 seems to have the following problems. The drain lead is installed on a heat sink, and effectively radiates heat generated in response to the operation of the power MOSFET. One end of the DC power source is connected to the high-side drain lead, to which DC power having a fixed potential is applied. This is effective in enlarging the drain lead and improving the radiation performance.

On the contrary, a low-side drain lead is connected to the output terminal, and is applied with DC power having a fluctuating potential. If the drain lead is enlarged in order to improve the radiation performance, noises or parasitic capacitance tends to be increased. Increase of noises would raise the event provability of false operations while increase of parasitic capacitance slows down the operation speed. When the drain lead of the low-side power MOSFET is insulated from the heat sink, it is possible to suppress influence of noises. However, when insulated, more heat is generated by the power MOSFET, and the radiation performance of the heat sink cannot be raised due to thermal resistance.

SUMMARY OF THE INVENTION

The present invention is intended to provide a semiconductor device which can not only improve radiation performance of high-side and low-side switching elements constituting a bridge circuit but also can reduce noises, parasitic capacitance and false operations, and accelerate the operation.

According to a first feature of the embodiment of the invention, a semiconductor device includes: a first die pad having the conductivity connected to one end of a DC power source; a second die pad having the conductivity connected to the other end of the DC power source; a first switching element provided on the first die pad, receiving DC power from DC power source via the first die pad, and having a terminal connected to a first output terminal, the terminal being opposite to the first die pad; and a second switching element provided on the second die pad, receiving the DC power from DC power source via the second die pad, and having a terminal connected to the first output terminal, the terminal being opposite to the second die pad.

In accordance with a second feature of the embodiment of the invention, a semiconductor device includes: a first die pad having the conductivity connected to one end of a DC power source; a second die pad having the conductivity connected to the other end of the DC power source; a first switching element provided on the first die pad, receiving DC power from DC power source via the first die pad, and having a terminal connected to a first output terminal, the terminal being opposite to the first die pad; a third switching element provided on the first die pad, receiving the DC power from DC power source via the first die pad, and having a terminal connected to a second output terminal, the terminal being opposite to the second die pad; a fifth switching element provided on the first die pad, receiving the DC power from the DC power source via the first die pad, and having a terminal connected to the first output terminal, the terminal being opposite to the first die pad; a second switching element provided on the second die pad, receiving the DC power from the DC power source via the second die pad, and having a terminal connected to the first output terminal, the terminal being opposite to the second die pad; a fourth switching element provided on the second die pad, receiving the DC power from the DC power source via the second die pad, and having a terminal connected to the second output terminal, the terminal being opposite to the second die pad; and a sixth switching element provided on the second die pad, receiving the DC power from the DC power source via the second die pad, and having a terminal connected to the third output terminal, the terminal being opposite to the second die pad.

DETAILED DESCRIPTION OF THE INVENTION

The invention will be described with reference to embodiments shown in the drawings. Like or corresponding parts are denoted by like or corresponding reference numerals. The drawings are schematic, and components may differ from those in actual products. Further, different scales may be used in drawings.

While the invention will be described by means of specific embodiments to realize the technical concept of the invention and arrangement of components, numerous modifications and variations could be made thereto without departing from the scope of the invention set forth in the claims.

First Embodiment

In a first embodiment, a semiconductor device 1 is incorporated in a system 5 for driving a high voltage three-phase motor.

[Configuration of Three-Phase Motor Driving System]

Figure 4:
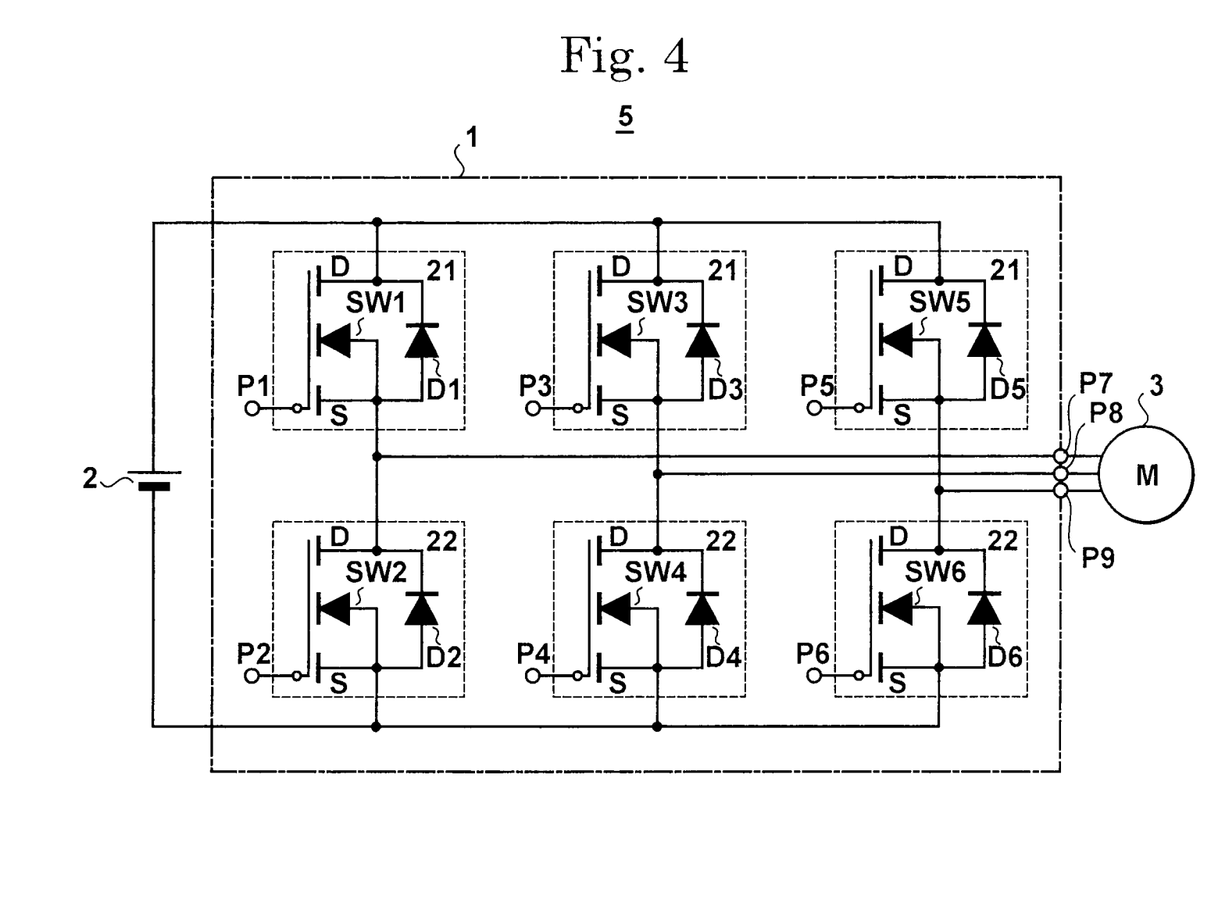
FIG. 4 is a circuit diagram of a three-phase motor driving system in which the semiconductor device of FIG. 1 is incorporated.

Referring to FIG. 4, the semiconductor device 1 is incorporated in the high voltage three-phase motor driving system 5. The high voltage three-phase motor driving system 5 includes the semiconductor device 1, a DC power source 2 which supplies DC power to the semiconductor device 1, and a three-phase electric motor 3 which is driven by the semiconductor device 1. Although not shown in FIG. 4, the high voltage three-phase motor driving system 5 further includes a controller for operating and controlling first switching elements SW1 to SW6 of the semiconductor device 1. The controller is built in the semiconductor device 1. Alternatively, the controller may be attached to the semiconductor device 1 as an external unit.

The semiconductor device 1 includes a total of six switching elements, i.e. first to sixth switching element SW1 to SW6, and a total of six diode elements, i.e. first to six diode elements D1 no D6.

The first switching element SW1 is a high-side switching element while the second switching element SW2 is a low-side switching element. The first and second switching elements SW1 and SW2 are paired to constitute a half-bridge circuit.

A first main electrode (a drain or collector electrode) of the first switching element SW1 is connected to one end of a high potential terminal (+) of the DC power source 2. A second main electrode (a source or emitter electrode) is connected to a first output terminal P7. The first output terminal P7 is used to provide a U-phase driving voltage to the three-phase motor 3. A control electrode (a gate or base electrode) of the first switching element SW1 is connected to a control signal input terminal P1. The first diode element D1 is electrically connected in parallel between the first and second main electrodes of the first switching element SW1. Specifically, a cathode electrode of the first diode element D1 is connected to the first main electrode while an anode electrode of the first diode element D1 is connected to the second main electrode. The first diode element D1 functions as a regenerative diode.

A third main electrode (a source or emitter electrode) of the second switching element SW2 is connected to a low potential (−) terminal of the DC power source 2. A fourth main electrode (a drain or collector electrode) of the second element SW2 is connected to the first output terminal P7 which is in connection with the second main electrode of the first switching element SW1. A control electrode (a gate or base electrode) of the second switching element SW2 is connected to a control signal input terminal P2. The diode element D2 is electrically connected in parallel between the third and fourth main electrodes of the second switching element SW2. Specifically, the second diode element D2 has its anode and cathode electrodes respectively connected to the third and fourth main electrodes of the second switching element SW2. The second diode element D2 functions as a regenerative diode similarly to the first diode element D1.

The third switching element SW3 is a high-side switching element while the fourth switching element SW4 is a low-side switching element. The third and fourth switching elements SW3 and SW4 are paired to constitute a half-bridge circuit.

A fifth main electrode (a drain or collector electrode) of the third switching element SW3 is connected to the high-side potential (+) terminal of the DC power source 2. A sixth main electrode (a source or emitter electrode) of the switching element SW3 is connected to a second output terminal P8, via which a V-phase driving voltage for the three-phase motor is provided. A control electrode (a gate or base electrode) of the third switching element SW3 is connected to a control signal input terminal P3. The third diode element D3 is electrically connected in parallel between the fifth and sixth main electrodes of the third switching element SW3. Specifically, the third diode element D3 has its cathode and anode electrodes respectively connected to the fifth and sixth main electrodes. The third diode element D3 functions as a regenerative diode similarly to the first diode element D1.

A seventh main electrode (a source or emitter electrode) of the fourth switching element SW4 is connected to the low-potential (−) terminal of the DC power source 2. An eighth main electrode (a drain or collector electrode) of the fourth switching element SW4 is connected to the second output terminal P8 which is in connection with the sixth main electrode of the third switching element SW3. A control electrode (a gate or base electrode) of the fourth switching element SW4 is connected to a control signal input terminal P4. The fourth diode element D4 is electrically connected in parallel between the seventh and eighth main electrodes of the fourth switching elements SW4. Specifically, the fourth diode element D4 has its anode and cathode electrodes respectively connected to the seventh and eighth main electrodes. The fourth diode element D4 functions as a regenerative diode similarly to the first diode element D1.

The fifth switching element SW5 is a high-side switching element while the sixth switching element SW6 is a low-side switching element. The fifth and sixth switching elements SW5 and SW6 are paired to constitute a half-bridge circuit.

A ninth main electrode (a drain or collector electrode) of the fifth switching element SW5 is connected to the high-potential (+) terminal of the DC power source 2. A tenth main electrode (a source or emitter electrode) of the fifth switching element SW5 is connected to a third output terminal P9. The third output terminal P9 is used to provide a W-phase driving voltage to the three-phase motor 3. A control electrode (a gate or base electrode) of the fifth switching element SW5 is connected to a control signal input terminal P5. The fifth diode element D5 is electrically connected in parallel between the ninth and tenth main electrodes. Specifically, the fifth diode element D5 has its cathode and anode electrodes respectively connected to ninth and tenth main electrodes. The fifth diode element D5 functions as a regenerative diode similarly to the first diode element D1.

An eleventh main electrode (a source or emitter electrode) of the sixth switching element SW6 is connected to the low-potential (−) terminal of the DC power source 2. A twelfth main electrode (a drain or collector electrode) of the switching element SW6 is connected to a third output terminal P9 which is in connection with the tenth main electrode of the fifth switching element SW5. A control electrode (a gate or base electrode) of the sixth switching element SW6 is connected to a control input terminal P6. The sixth diode element D6 is electrically connected in parallel between the eleventh and twelfth main electrodes. Specifically, the sixth diode element D6 has its cathode and anode electrodes respectively connected to eleventh and twelfth main electrodes. The sixth diode element D6 functions as a regenerative diode similarly to the first diode element D1.

The first output terminal P7, second output terminal P8 and third output terminal P9 are connected to the three-phase motor 3, which is driven in response to driving signals from the foregoing output terminals.

[Device Configuration of Semiconductor Device]

Figure 3:
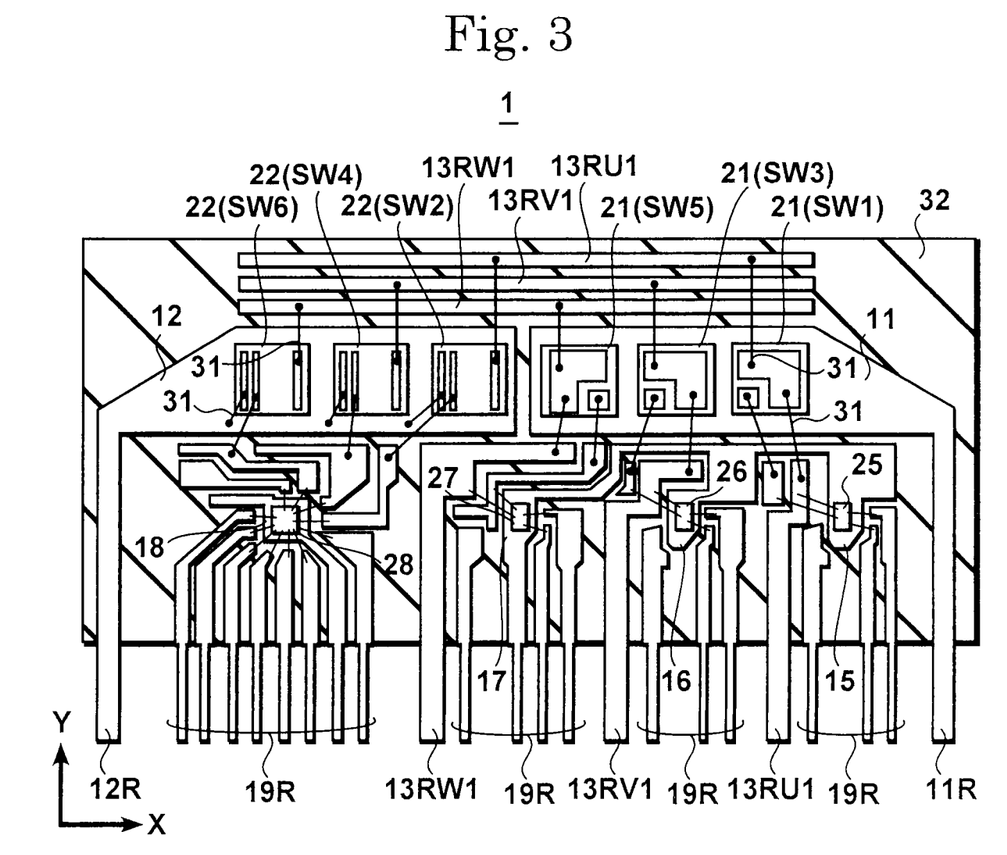
FIG. 3 is a top plan view of the semiconductor device of the first embodiment.

As shown in FIG. 3, the semiconductor device 1 incorporated in the foregoing high voltage three-phase motor driving system 5 is provided with the following components: a first conductive die pad 11 connected to the high-potential terminal of the DC power source 2; a second conductive die pad 12 connected to the low-potential terminal of the DC power source 2; a semiconductor element 21 (SW1) which exists on the die pad 11, receives DC power from the DC power source 2 via the die pad 11, and includes the first switching element SW1 whose main electrode (terminal) opposite to the die pad 11 is connected to the first output terminal P7; a semiconductor element 21 (SW3) which exists on the first die pad 11, receives the DC power from the DC power source 2 via the die pad 11, and includes the third switching element SW3 whose main electrode (terminal) opposite to the first die pad 11 is connected to the second output terminal P8; a semiconductor element 21 (SW5) which exists on the first die pad 11, receives the DC power from the DC power source 2 via the die pad 11, and includes the switching element SW5 whose main electrode (terminal) opposite to the first die pad 11 is connected to the second output terminal P9; a semiconductor element 22 (SW2) which exists on the second die pad 12, receives the DC power from the DC power source 2 via the second die pad 12, and includes the switching element SW2 whose main electrode (terminal) opposite to the second die pad 12 is connected to the first output terminal P7; a semiconductor element 22 (SW4) which exists on the second die pad 12, receives the DC power from the DC power source 2 via the second die pad 12, and includes the switching element SW4 whose main electrode (terminal) opposite to the second die pad 12 is connected to the first output terminal P8; and a semiconductor element 22 (SW6) which exists on the second die pad 12, receives the DC power from the DC power source 2 via the second die pad 12, and includes the switching element SW6 whose main electrode (terminal) opposite to the second die pad 12 is connected to the first output terminal P9.

Further, the semiconductor device 1 includes the following: a third die pad 15; a semiconductor element 25 provided on the third die pad 15; a fourth die pad 16; a semiconductor element 26 provided on the fourth die pad 16; a fifth die pad 17; a semiconductor element 27 provided on the fifth die pad 17; a sixth die pad 18; and a semiconductor element 28 provided on the sixth die pad 18. The first to sixth die pads 11 and 12, 15 to 18 and semiconductor elements 21, 22, 25 to 28 are airproof molded in a package 32. The semiconductor elements 25 to 28 are provided with controllers. The first to sixth switching elements SW1 to SW6 are placed on the first and second die pads 11 and 12. Then, the distance of the first switching element SW1 and the second switching element SW2, the third switching element SW3 and the fourth switching element SW4, and fifth switching element SW5 and sixth switching element SW6 become respectively almost equal.

The first die pad 11 serves in common for the three high-side semiconductor elements 21 having the first, third and fifth switching elements SW1, SW3 and SW5, i.e. the first die pad 11 is integral to the switching elements SW1, SW3 and SW5. Referring to FIG. 3, the first die pad 11 is rectangular in a direction X (first direction). The three semiconductor elements 21 are linearly arranged in the direction X with certain intervals. This arrangement is not always essential. As shown at the right side in FIG. 3, the first die pad 11 is formed at one end of a lead 11R (i.e. is electrically connected to the lead 11R). The other end of the lead 11R extends outward in a direction Y (second direction) from an interior of the package 32. One end of the DC power source 2 is connected to the lead 11R. The first die pad 11 is made of a conductive metal plate such as Cu, a Cu alloy, or Fe—Ni alloy, which has low thermal resistance and good heat radiation performance. The first die pad 11 is thicker than the lead 11R in order to improve the heat radiation performance.

The second die pad 12 serves in common for the three low-side semiconductor elements 22 having the second, fourth and sixth switching elements SW2, SW4 and SW6, i.e. the second die pad 12 is integral to the switching elements SW2, SW4 and SW6. The second die pad 12 is rectangular in the direction X. The three semiconductor elements 22 are linearly arranged in the direction X with certain intervals. As shown at the left side in FIG. 3, the second die pad 12 is formed at one end of a lead 12R (i.e. is electrically connected to the lead 12R). The end of the lead 12R extends outward in the direction Y from the interior of the package 32. The other end of the DC power source 2 is connected to the lead 12R. The second die pad 12 is made of the material same as that of the first die pad 11, and is as thick as the first die pad 11. By separating from the lead 12R in the direction X of FIG. 3, the lead 11R have formed it, and the lead 11R and the lead 12R are being derived from package 32. The clearance between the lead 11R and the lead 12R is the biggest.

As shown at the lower part of FIG. 3, leads 13RU1, 13RV1 and 13RW1 extend outward in the direction Y from the interior of the package 32. The lead 13RU1 serves as the first output terminal P7, the lead 13RV1 serves as the second output terminal P8, and the lead 13RW1 serves as the third output terminal P9. The foregoing leads are made of the material same as that of the first and second die pads 11 and 12, and are thinner than the first and second die pads 11 and 12.

Referring to an upper part of FIG. 3, leads 13RU2. 13RV2 and 13RW2 extend into the package 32 in the direction X. The lead 13RU2 electrically connects the second main electrode of the first switching element SW1 of the semiconductor element 21 (SW1) to the fourth main electrode of the second switching element SW2 of the semiconductor element 22 (SW2), and serves as an auxiliary wiring for connecting the foregoing main electrodes to the first output terminal P7. The lead 13RV2 electrically connects the sixth main electrode of the fourth switching element SW3 of the semiconductor element 21 (SW4) to the eighth main electrode of the third switching element SW3 of the semiconductor element 22 (SW4), and serves as an auxiliary wiring for connecting the foregoing main electrodes to the first output terminal P8. The lead 13RW2 electrically connects the tenth main electrode of the fifth switching element SW5 of the semiconductor element 21 (SW5) to the twelfth main electrode of the sixth switching element SW6 of the semiconductor element 22 (SW6), and serves as an auxiliary wiring for connecting the foregoing main electrodes to the first output terminal P9. The foregoing leads are made of the material same as that of the leads 13RU1, 13RV1 and 13RW1, and are as thick as the leads 13RU1, 13RV1 and 13RW1.

As shown at the lower part of FIG. 3, a controller which is provided on a semiconductor element 25 on the third die pad 15 but is not shown is connected to the control signal input terminal P1 (shown in FIG. 4) of the first switching element SW1 of the semiconductor element 21 (SW1). Another controller which is provided on the semiconductor element 26 on the fourth die pad 16 but is not shown is connected to the control signal input terminal P3 of the third switching element SW3 of the semiconductor element 21 (SW3). A further controller which is provided on the semiconductor element 27 on the fifth die pad 17 but is not shown is connected to the control signal input terminal P5 of the fifth switching element SW5 of the semiconductor element 21 (SW5).

A sixth die pad 18 is shown near the center of FIG. 3. A controller which is provided on the semiconductor element 28 on the sixth die pad 18 but not shown is connected to the control signal input terminal P2 of the second switching element SW2 of the semiconductor element 22 (SW2), the control signal input terminal P4 of the fourth switching element SW4 of the semiconductor element 22 (SW4), and the control signal input terminal P6 of the sixth switching element SW6 of the semiconductor element 22 (SW6).

One end each of leads 19R is present round the third to sixth die pads 15 to 18. The opposite ends of the leads 19R extend in the package 32 in an appropriate manner, and are drawn out in the direction Y.

A wire 31 is used in the package 32, and is made of a very conductive material such as Au, an Al, Cu or the like. The wire 31 is bonded using a wire bonding machine.

The package 32 is made of resin such as epoxy resin, and is molded by the transfer molding process.

[Device Configuration of High-Side Semiconductor Device]

Figure 2:
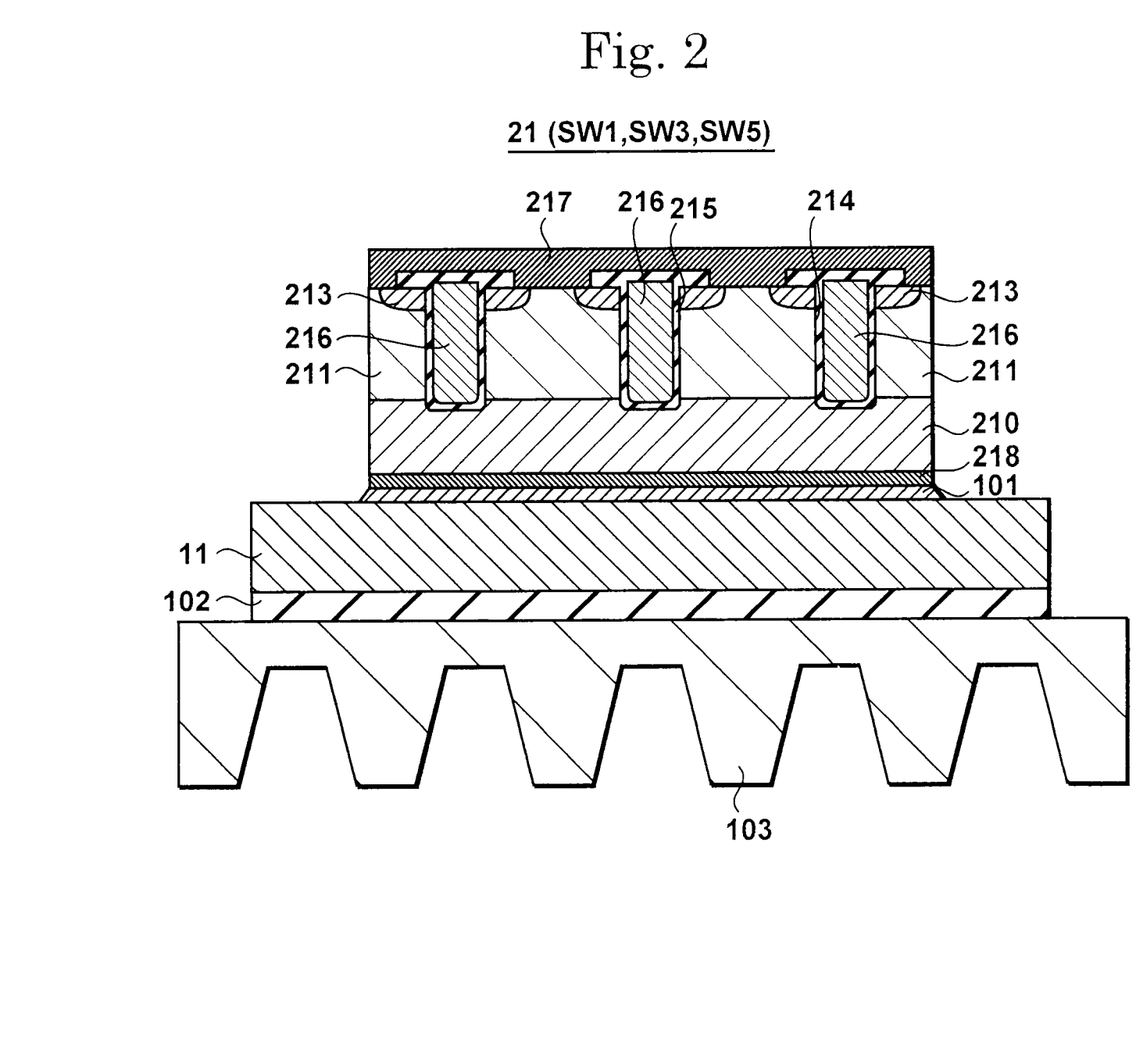
FIG. 2 is a cross sectional view of an essential part of high-side semiconductor elements provided in the semiconductor device in the first embodiment of the invention.

The first, third and fifth switching elements SW1, SW3 and SW5 mounted on the semiconductor element 21 are respectively vertical power transistors. Referring to FIG. 2, each power transistor has the following: an n-type drain layer 210; a p-type drift layer 211 on the drain layer 210; an n-type source layer 213 on the p-type drift layer 211 (main surface); a trench 214 extending from the source layer 213 to the drain layer 210 through the drift layer 211; and a gate-insulating film 215 extending on an inner surface and a bottom of the trench 214; a gate electrode (control electrode) 216 embedded in the trench 214 via the gate-insulating film 215. In other words, each power transistor is a vertical MOSFET (metal oxide semiconductor field effect transistor), which is a silicon semiconductor.

Each of the drain layer 210 and the drift layer 211 is a laminated circuit board which is constituted by silicon single crystal substrates or a laminated circuit board in which silicon single crystal substrates are stuck by the epitaxial growth. The source layer 213 is a semiconductor region which is formed by doping impurities into the drift layer 211 by the ion implantation or diffusion. The trench 214 is formed by applying the reactive ion etching (RIE) or anisotropic etching to a silicon single crystal substrate or a laminated circuit board. The gate-insulating film 215 is a silicon oxide film, for instance. The gate electrode 216 is a silicon poly-crystalline film, for instance.

A second, sixth or tenth main electrode 217 is formed on the source layer 213 and the drift layer 211, i.e. on the main surface. The main electrode 217 is made of a very conductive Al film or a very conductive Al alloy film or the like.

A first, fifth or ninth main electrode 218 is formed under the drain layer 210, i.e. on the surface of the first die pad 11 (the surface being opposite to the front surface of the circuit board). The main electrode 218 is made of a conductive Al film, Al—Au alloy film or the like.

The first, fifth or ninth main electrode 218 faces the front surface of the die pad 11, and is electrically and mechanically connected (die-bonded) to the die pad 11 using a conductive adhesive 101. The conductive adhesive 101 is solder, for instance.

The first die pad 11 is connected to the high-side (high potential) terminal of the DC power source 2. In the semiconductor element 21, the DC current vertically flows from the first die pad 11 to the second, six or tenth main electrode 217 via the first, fifth or ninth main electrode 218.

The vertical power transistors are not always limited to MOSFETs. Alternatively, MISFETs (metal insulator semiconductor field effect transistors) which are prepared by using the gate insulating film 215 made of a nitride film, or IGBTs (insulated gate bipolar transistors) are also usable.

Although not shown, the semiconductor element 21 includes the first diode D1, third diode D3 or fifth diode D5. Alternatively, the first, third or fifth diode D1, D3 or D5 may be an external part of the semiconductor element 21.

A first heat sink 103 is provided on an undersurface of the first die pad 11 via an insulator 102, and efficiently radiates heat from the first die pad 11 to the exterior of the package 32. The insulator 102 is made of molded resin, mica, ceramics or the like which has good thermal conduction. The first heat sink 103 includes heat radiating fins. Alternatively, heat radiating plates may be used. The first heat sink 103 is preferably made of a conductive metal such as Al. When electrically insulating the first heat sink 103 and the low-side semiconductor elements, the first die pad 11 and the first heat sink 103 can be directly connected without using the insulator 102, thereby improving the heat radiating efficiency.

[Device Configuration of Low-Side Semiconductor Element]

Figure 1:
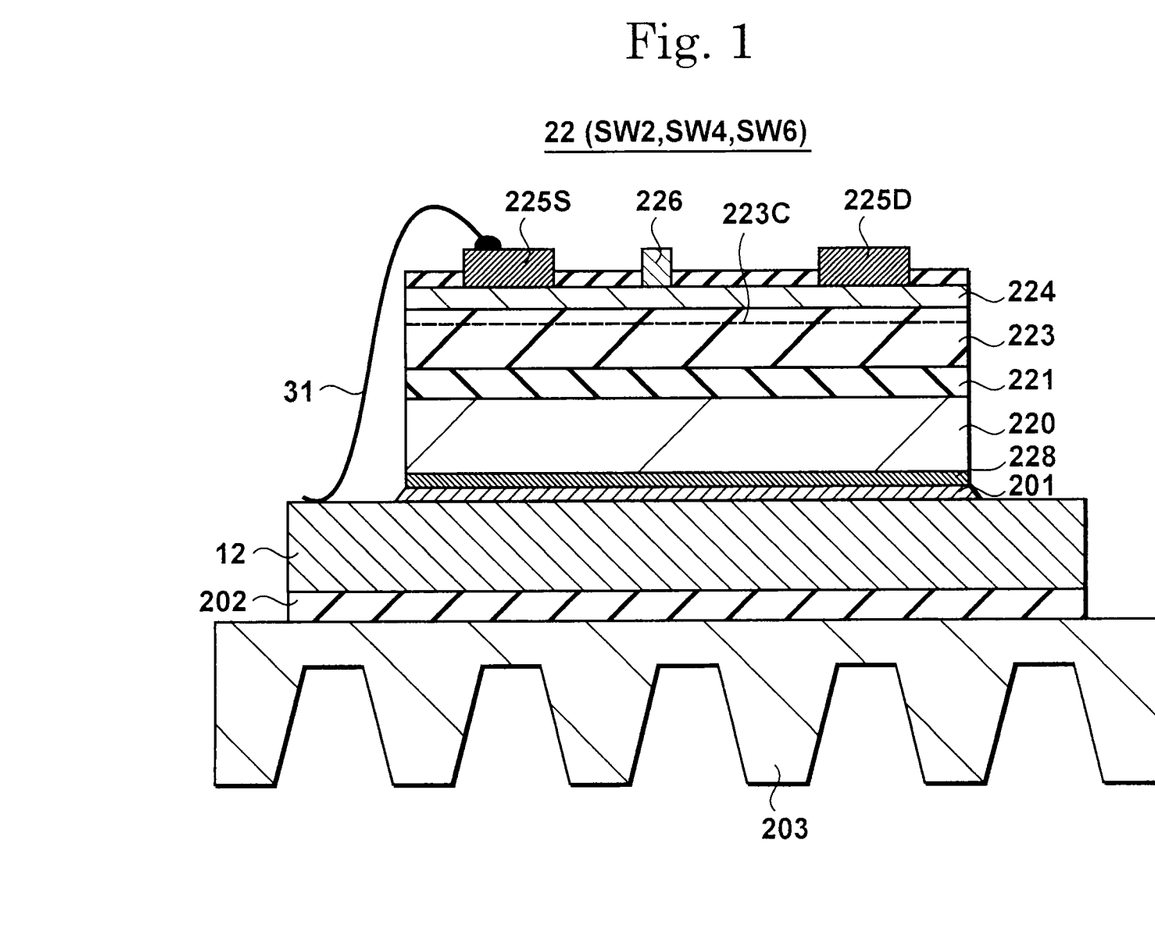
FIG. 1 is a cross sectional view of an essential part of low-side semiconductor elements provided in a semiconductor device in a first embodiment of the invention.

The second, fourth and sixth switching elements SW2, SW4 and SW6 incorporated in the semiconductor element 22 are horizontal power transistors. Referring to FIG. 1, each power transistor is constituted by the following components: a silicon single crystal substrate 220; a buffer layer 221 on the silicon single crystal substrate 220; an electron transit layer 223 on the buffer layer 221 and having a two-dimensional carrier gas channel region 223C; an electron supply layer 224 on the electron transit layer 223; the third, seventh or eleventh main electrode (source electrode) 225S; the fourth, eighth or twelfth main electrode (drain electrode) 225D; and a gate electrode 226. The semiconductor element may have a configuration different from what described above. In the first embodiment, the semiconductor element 22 is a compound semiconductor of GaN, AlN or the like. In short, the power transistor is a horizontal HEMT (high electron mobility transistor). More specifically, an n-channel conductive HEMT is utilized. The power transistor is the compound semiconductor.

The silicon single crystal substrate 220 is used as an inexpensive substrate for making compound semiconductor layers using the epitaxial growth process. A substrate electrode 228 is provided on the rear surface of the silicon single crystal substrate 220, i.e. on the front surface of the second die pad 12. The substrate electrode 228 is used to keep the silicon single crystal substrate 220 at the fixed potential. The silicon single crystal substrate 220 receives the DC power of the fixed potential via the second die pad 12 and the substrate electrode 228 from the DC power source 2. The substrate electrode 228 is made of a conductive metallic material such as an Au—Ni alloy or the like. In the first embodiment, silicon is used as a material for the substrate electrode. Alternatively, silicon carbide (SiC), sapphire, GaN, AlN and so on are usable.

The buffer layer 221 is constituted by GaN layers and MN layers which are alternately stacked. The buffer layer 221 may have another structure, and is not always indispensable. The electron transit layer 223 is preferably a GaN layer, for instance. The electron supply layer 224 is preferably made of AlGaN. The electron transit layer 223 and the electron supply layer 224 may be made of materials different from those described above.

The third, seventh or eleventh main electrode (source electrode) 225S and the fourth, eighth or twelfth main electrode (drain electrode) 225D are made of Ti films and Al films placed on the Ti films. The gate electrode 226 is made of a Ti film, an Ni film placed on the Ti film, and an Au film placed on the Ti and Ni films. The materials of the foregoing electrodes are not always limited to those mentioned above.

The substrate electrode 228 of the semiconductor element 22 is mechanically and electrically die-bonded to the front surface of the second die pad 12 using the conductive adhesive 201, which is solder, for instance. In the first embodiment, the third, seventh or eleventh main electrode 225S of the semiconductor element 22 is electrically connected to the second die pad 12 via the wire 31. The DC power having the fixed low potential is applied from the low-side terminal of the DC power source 2 to the second die pad 12, and is also supplied to the third, seventh or eleventh main electrode 225S of the semiconductor element 22 and the silicon single crystal substrate 220. The semiconductor element 22 includes a horizontal power transistor, to which a current flows horizontally on the front surface of the second die pad 12 from the fourth, eighth or twelfth main electrode (drain electrode) 225D to the third, seventh or eleventh main electrode (source electrode) 225S.

The horizontal power transistor is not always limited to the HEMT. Alternatively, a power transistor such as a MOSFET, MISFET, and IGBT, MESFET (metal semiconductor filed effect transistor) may be usable.

Although not shown, the semiconductor element 22 includes the second diode D2, fourth diode D4 or sixth diode D6. The diodes may be prepared as external elements for the semiconductor element 22.

A second heat sink 203 is provided on an underside of the second die pad 12 via an insulator 202, and functions to effectively radiate heat from the second die pad 12 to the exterior of the package 32. The second heat sink 203 is similar to the first heat sink 103.

When the DC power of a ground potential is supplied to the second die pad 12 from the DC power source 2, the second die pad 12 may be directly connected to the second heat sink 203 without using the insulator 202. In such a case, the second heat sink 203 may be directly earthed, or may be indirectly earthed via a capacitor. Heat radiation can be further promoted by directly connecting the second die pad 12 and the heat sink 203. Further, when either the insulator 102 or the insulator 202 is provided, the first and second heat sinks 103 and 203 can be combined and become large, which is effective in improving the heat radiation performance.

[Features of Semiconductor Device]

In the semiconductor device of the first embodiment, the first, fifth or ninth main electrode (drain electrode) 218 is disposed on the rear surface of the semiconductor element 21 which includes the first, third and fifth high-side switching elements SW1, SW3 and SW5 and constitutes the half-bridge circuit. The semiconductor element 21 is installed on the first die pad 11. The substrate electrode 228 is disposed on the rear surface of the semiconductor element 22 which includes the low-side second, fourth and sixth switching elements SW2, SW4 and SW6. The semiconductor element 22 is disposed on the second die pad 12, which is connected to the third, seventh and eleventh main electrodes (source electrodes) 225S. The DC power having the fixed potential (one fixed potential) is supplied from the DC power source 2 to the first die pad 11, and is then applied to the semiconductor element 21 via the first die pad 11. Heat generated by the operation of the semiconductor element 21 can be effectively radiated to the first die pad 11. The DC power having the fixed potential (other fixed potential) can be supplied from the DC power source 2 to the second die pad 12. The DC power having the fixed potential (one fixed potential) is then applied to the semiconductor element 21. Heat generated by the operation of the semiconductor element 21 can be effectively radiated to the second die pad 12. Therefore, the first and second die pads 11 and 12 are enlarged, which is effective in improving the heat radiation. In such a case, parasitic capacitance is increased between the first die pad 11 and the heat sink 103 and between the second die pad 12 and the second heat sink 203. Since the parasitic capacitance is not applied to a charge or discharge path of the DC power, a switching speed is not adversely affected. Further, the two kinds of the DC power having the one and other fixed potentials are applied to the first and second die pads 11 and 12, so that no potential fluctuations are caused at the first die pad 11 and second die pad 12. This is effective in reducing noises.

[Modified Example of Low-Side Semiconductor Element]

Figure 5:
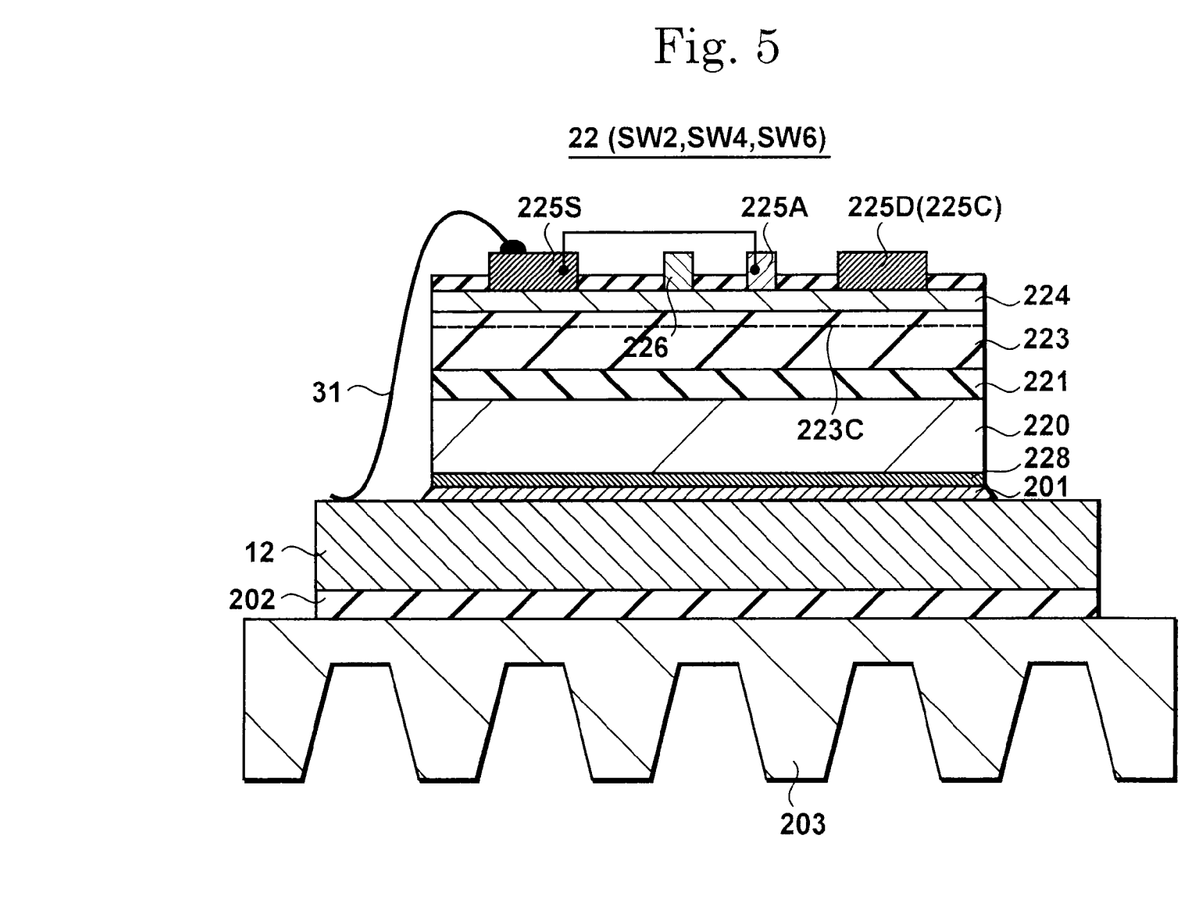
FIG. 5 is a cross sectional view of an essential part of low-side semiconductor elements in a modified example of the semiconductor device of the first embodiment.

With the low-side semiconductor element 22 of the semiconductor device 1 of the first embodiment, the second diode D2 can be made integral with the second switching element SW2 as shown in FIG. 5. Further, the fourth diode D4 can be made integral with the fourth switching element SW4. This configuration is also applicable to the sixth diode D6 and the sixth switching element SW6.

The second diode D2 is realized by using the fourth main electrode (drain electrode) 225D also as the cathode electrode 225C, and by arranging an anode electrode 225A between the cathode electrode 225 and the gate electrode 226. The second diode D2 is a Sschottky barrier diode (SBD). The fourth diode D4 is realized by using the eighth main electrode (drain electrode) 225D also as the cathode electrode 225C, and by arranging the anode electrode 225A between the cathode electrode 225C and the gate electrode 226. The fourth diode D4 is an SBD. The sixth diode D6 is realized by using the twelfth main electrode (drain electrode) 225D also as the cathode electrode 225C, and by arranging the anode electrode 225A between the cathode electrode 225C and the gate electrode 226. The sixth diode D6 is an SBD.

Second Embodiment

A second embodiment of the semiconductor device 1 relates to a modified example of the low-side semiconductor element 22.

Figure 6:
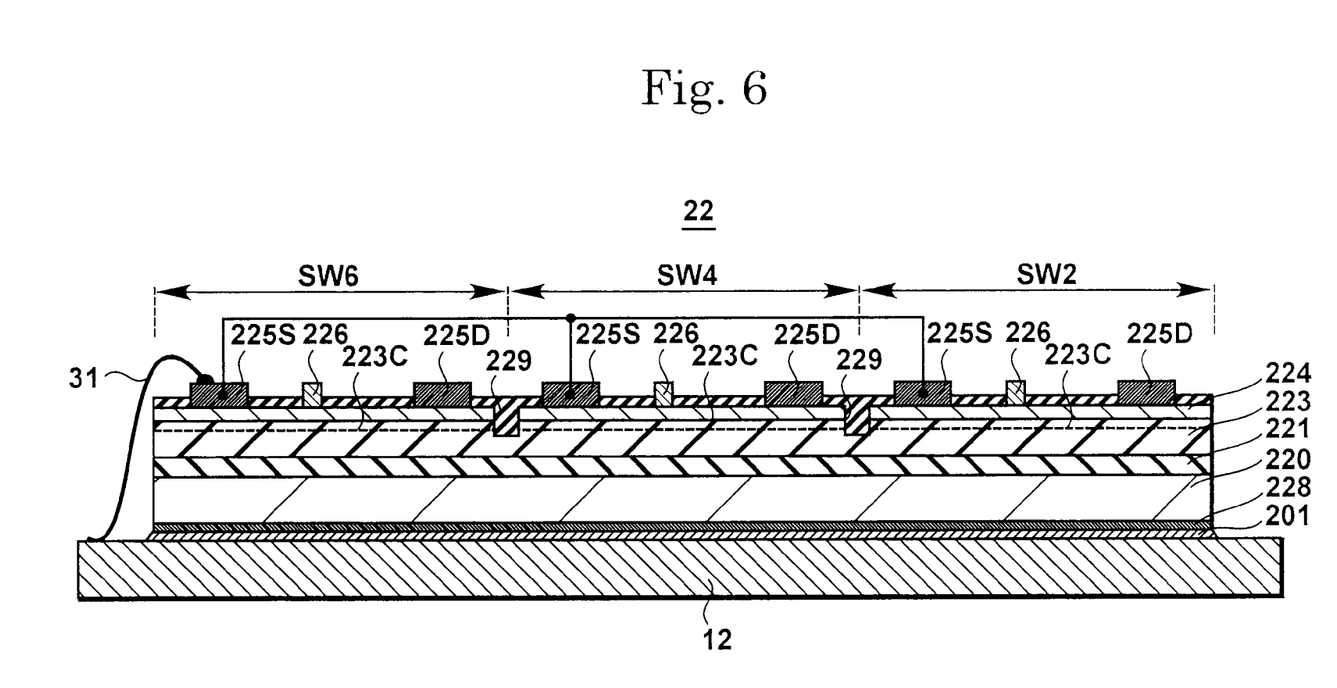
FIG. 6 is a cross sectional view of an essential part of low-side semiconductor elements provided in a semiconductor device in a second embodiment of the invention.

The DC power having the fixed potential same as that applied to the substrate electrode 228 is also applied to the third main electrode (source electrode) 225 of the second low-side switching element SW2, to the seventh main electrode (source electrode) 225S of the fourth switching element SW7, and to the eleventh main electrode (source electrode) 225S of the sixth switching element SW6. In other words, the second, fourth and sixth switching elements SW2, SW4 and SW6 can be fabricated on one common silicon single crystal substrate 220 as one chip. Refer to FIG. 6.

The second, fourth and sixth switching elements SW2, SW4 and SW6 are electrically separated by trenches 229. Alternatively, these switching elements may be isolated by implanting Fe ions between them.

The semiconductor device 1 of the second embodiment is as advantageous as the semiconductor device 1 of the first embodiment. Further, the second embodiment can reduce the spaces between the second, fourth and sixth switching elements SW2, SW4 and SW6 which can be fabricated as one chip.

Other Embodiments

While the invention herein disclosed has been described by means of specific embodiments, numerous modifications an variations could be made thereto.

The invention has been described with reference to the semiconductor devices which are incorporated into three-phase high voltage motor driving systems. Alternatively, the invention is also applicable a four-or-more-phase switching power supply system, a power switching system including a full-bridge circuit or a half-bridge circuit, and so on.

In the foregoing embodiments, the vertical power transistor is used as the high-side semiconductor element 21. Alternatively, the high-side semiconductor element 21 may be a horizontal power transistor, and has a structure for drawing the drain (or collector) electrode out of both front and rear surfaces. Further, the semiconductor element 21 may be a vertical or horizontal or vertical compound semiconductor element made of SiC, GaN or the like.

The low-side switching elements are piled up on one substrate in the foregoing embodiments. The high-side switching elements may be piled on one substrate by a well-known method.

The third, seventh and eleventh main electrodes (source electrodes) 225S of the low-side semiconductor element 22 are respectively connected to the second die pad 12 by the wire 31. Alternatively, the wire 31 may be replaced with a metal pattern wiring formed on the side surface of the semiconductor element 22, a via-hole wiring formed in a via hole through the front and rear surfaces of the semiconductor element 22, or the like.

Further, the invention is applicable to a complex element in which one switching element is constituted by a combination of a silicon semiconductor element, and a normally-on compound semiconductor element.

According to the invention, it is possible to provide a semiconductor device which can not only improve heat radiation performance of high-side and low-side switching elements constituting a bridge circuit but also can reduce noises, parasitic capacitance and false operations, and accelerate the operation.

INDUSTRIAL APPLICABILITY

The invention is applicable to a semiconductor device which can improve heat radiation of switching elements, reduce noise and parasitic capacitance, suppress false operation, and accelerate operation speeds.

What is claimed is:

1. A semiconductor device comprising:
a first die pad having a conductivity and electrically connected to one end of a power source to supply high potential power;
a second die pad having a conductivity and electrically connected to another end of the power source to supply a low potential power;
a first switching element provided on the first die pad, receiving the high potential power from the power source via the first die pad, and having a terminal connected to a first output terminal, the terminal being opposite to the first die pad; and
a second switching element provided on the second die pad, receiving the low potential power from the power source via the second die pad, and having a terminal connected to the first output terminal, the terminal being opposite to the second die pad, wherein
the first switching element includes a first main electrode which is formed on a side of the first die pad and receives the high potential power, a second main electrode which is formed at a position opposite to the first main electrode and is electrically connected to the first output terminal, the first switching element having a vertical structure in which a current flows vertically on the front surface of the first die pad; and
the second switching element includes a substrate electrode which is formed on a side of the second die pad and receives the low potential power, a third main electrode which is formed at a position opposite to the substrate electrode and is electrically connected to the substrate electrode, and a fourth main electrode electrically connected to the first output terminal, the second switching element having a horizontal structure in which a current flows horizontally on the surface of the second die pad.

2. The semiconductor device of claim 1 further comprising:
heat sinks provided on the first and second die pads; and
an insulator provided either between the first die pad and the heat sinks or between the second die pad and the heat sinks.

3. The semiconductor device of claim 1 further comprising:
a first diode electrically connected in parallel between the first and second main electrodes of the first switching element; and
a second diode electrically connected in parallel between the third and fourth main electrodes of the second switching element.

4. A semiconductor device comprising:
a first die pad having a conductivity and electrically connected to one end of a power source to supply a high potential power;

a second die pad having a conductivity and electrically connected to another end of the power source to supply a low potential power;

a first switching element provided on the first die pad, receiving the high potential power from the power source via the first die pad, and having a terminal connected to a first output terminal, the terminal being opposite to the first die pad;

a third switching element provided on the first die pad, receiving the high potential power from the power source via the first die pad, and having a terminal connected to a second output terminal, the terminal being opposite to the first die pad;

a fifth switching element provided on the first die pad, receiving the high potential power from the power source via the first die pad, and having a terminal connected to a third output terminal, the terminal being opposite to the first die pad;

a second switching element provided on the second die pad, receiving the low potential power from the power source via the second die pad, and having a terminal connected to the first output terminal, the terminal being opposite to the second die pad;

a fourth switching element provided on the second die pad, receiving the low potential power from the power source via the second die pad, and having a terminal connected to the second output terminal, the terminal being opposite to the second die pad; and a sixth switching element provided on the second die pad, receiving the low potential power from the power source via the second die pad, and having a terminal connected to the third output terminal, the terminal being opposite to the second die pad, wherein each of the first, third and fifth switching elements includes a first main electrode which is formed on a side of the first die pad and receives the high potential power, a second main electrode which is formed at a position opposite to the first main electrode and is electrically connected to the first output terminal, the first switching element having a vertical structure in which a current flows vertically on the front surface of the first die pad; and each of the second, fourth and sixth switching elements includes a substrate electrode which is formed on a side of the second die pad and receives the low potential power, a third main electrode which is formed at a position opposite to the substrate electrode and is electrically connected to the substrate electrode, and a fourth main electrode electrically connected to the first output terminal, the second switching element having a horizontal structure in which a current flows horizontally on the surface of the second die pad.

5. The semiconductor device of claim 4, wherein the second, fourth and sixth switching elements are constituted as one unit on one common substrate.

6. The semiconductor device of claim 1, wherein the first switching element, or the first, third and fifth switching elements are silicon semiconductor elements, and the second switching element, or the second, fourth and sixth switching elements are chemical compound semiconductor elements.

7. The semiconductor device of claim 4, wherein the first switching element, or the first, third and fifth switching elements are silicon semiconductor elements, and the second switching element, or the second, fourth and sixth switching elements are chemical compound semiconductor elements.

8. A semiconductor device comprising:
a vertical device comprising:
a laminated circuit board;
a first main electrode disposed on a rear surface of the laminated circuit board; and
a second main electrode disposed on a front surface of the laminated circuit board, wherein a current vertically flows from the first main electrode to the second main electrode;
a horizontal device comprising:
a substrate;
a semiconductor layer disposed on the substrate;
a third and a fourth main electrodes disposed on the semiconductor layer; and
a first conductor connecting the third main electrode and the substrate electrically,
wherein a current horizontally flows from the third main electrode to the fourth main electrode;
a second conductor connecting the second main electrode and the forth main electrode electrically;
a first die pad connected to the first main electrode electrically, the first die pad being electrically connected to one end of a power source to supply high potential power; and
a second die pad connected to the substrate electrically, the second die pad being electrically connected to another end of the power source to supply low potential power.

9. The semiconductor device of claim 8, wherein the third main electrode of the horizontal device is electrically connected to the substrate by means of a wire.

10. The semiconductor device of claim 8 further comprising:
heat sinks provided on the first and second die pads; and
an insulator provided either between the first die pad and the heat sinks or between the second die pad and the heat sinks.

11. The semiconductor device of claim 8 further comprising:
a first diode electrically connected in parallel between the first and second main electrodes of the vertical device; and
a second diode electrically connected in parallel between the third and fourth main electrodes of the horizontal device.

* * * * *